United States Patent
Fasser et al.

[11] 4,008,433
[45] Feb. 15, 1977

[54] CAPACITANCE DISPLACEMENT TYPE MEASURING PROBE

[75] Inventors: Stuart S. Fasser; John D. Suitto, Jr., both of Schenectady, N.Y.; William R. Marklein, San Jose, Calif.

[73] Assignee: General Electric Company, Schenectady, N.Y.

[22] Filed: Jan. 14, 1976

[21] Appl. No.: 649,083

[52] U.S. Cl. ................... 324/61 P; 73/70; 318/490; 361/280
[51] Int. Cl.² ........................ G01R 27/26
[58] Field of Search ............. 324/61 P; 73/70, 71, 73/67.2, 71.4; 317/246; 318/490

[56] References Cited
UNITED STATES PATENTS

| | | | |
|---|---|---|---|
| 2,435,880 | 2/1948 | Eilenberger | 324/61 P |
| 3,031,617 | 4/1962 | Paquette | 324/61 P |
| 3,879,644 | 4/1975 | Maltby | 324/61 P X |

*Primary Examiner*—Stanley T. Krawczewicz
*Attorney, Agent, or Firm*—John F. Ahern; James W. Mitchell

[57] ABSTRACT

A capacitance displacement type measuring probe for measuring the vibration of a dynamoelectric machine including a dynamoelectric machine with helical grooves in its collector ring is disclosed. The probe measures the vibration of the dynamoelectric machine by measuring the change in capacitance of a capacitor established by the probe and the collector ring. The probe has a parallelogram sensing face which includes a sensing electrode having a parallelogrammed sensing surface whose axial length is of a predetermined dimension to coact with the parameters of the collector ring. The axial length of the sensing surface is formed such that the sensing surface scans a constant total high and total low area on the collector as the collector rotates. To measure vibration the probe is deployed at a fixed point in space with its parallelogrammed sensing face in parallel with the longitudinal axis of the rotating member to form a capacitor. The capacitor thus formed is placed in series with a resistor and series circuit is driven by an alternating current signal generator. Change in capacitance results in change of voltage across the capacitor to develop a signal related to vibration of the collector.

2 Claims, 4 Drawing Figures

CAPACITANCE DISPLACEMENT TYPE MEASURING PROBE

BACKGROUND OF THE INVENTION

1. Field of the Invention

This invention relates to a capacitance type displacement measuring probe for measuring the vibrations of a dynamoelectric machine.

2. Description of the Prior Art

It is necessary at the time a large dynamoelectric machine is manufactured and from time to time thereafter to check the machine and more particularly the rotor thereof for vibration. Since a dynamoelectric machine is susceptible to vibration, if excessive vibration occurs and is permitted to continue, the dynamoelectric machine may be damaged. Existing devices employed to measure the vibrations of a dynamoelectric machine are of several types. Devices of one type measure the vibration of the dynamoelectric machine by contacting a rotating member, such as the rotor, of the dynamoelectric machine and producing a signal proportional to the velocity of the rotating member. A disadvantage of the devices of this type is that chatter occurs as a result of the contact between the device and the rotating member.

Devices of a second type measure the vibration of a dynamoelectric machine by measuring the velocity of the rotor or rotating member of the dynamoelectric machine and producing a signal proportional to the vibration of the rotor of the machine. A disadvantage of measuring vibration in this manner is that devices of this type detect a change in vibration only if there is a change in the velocity of the rotating member. If velocity of the rotating member remains constant, the device will not detect a change in the vibration of the rotating member and thus the dynamoelectric machine may be damaged.

Another type of device measures the vibration of a dynamoelectric machine by measuring the change in capacitance of a capacitor formed by the device and a rotating collector ring of the dynamoelectric machine. A change in distance between the collector ring and the device caused by a change in vibration of the dynamoelectric machine is reflected as a change in capacitance. However, devices of this type only scan a locus of points around the collector ring and thus can accurately measure vibration only if the collector ring has a smooth surface. If a helical groove is placed in the surface of the collector ring, as is now common practice, for the purpose of avoiding uneven electrical brush wear, then this latter type device is unusable. Further, the accuracy of devices of this type is adversely affected by stray capacitance between the probe and other elements of the dynamoelectric machine.

By utilizing the capacitance displacement probe of the present invention, in a manner hereinafter more fully described, vibration of the rotor of a dynamoelectric machine can be measured without contacting the rotor, thereby avoiding the chatter that occurs as a result of direct contact between the probe and the rotor. Further, by utilizing the capacitance displacement probe of the present invention, the vibration of the rotor of a dynamoelectric machine can be accurately measured irrespectively of the velocity or change of velocity of the rotor. Further, by utilizing the probe of the present invention, vibration of the rotor of a dynamoelectric machine can be measured when a helical groove is utilized on the surface of a collector ring associated with the rotor. In addition, by utilizing the probe of the present invention, the vibration of the rotor of a dynamoelectric machine can be measured without the measurement being adversely affected by stray capacitance.

Accordingly, it is an object of this invention to provide a new and improved capacitance displacement measuring probe that measures the vibration of a dynamoelectric machine without contacting any rotating members of the dynamoelectric machine.

Another object of this invention is to provide a capacitance displacement measuring probe that accurately measures the vibrations of the rotor of a dynamoelectric machine irrespective of the velocity or change of velocity of the rotor of the dynamoelectric machine.

A further object of this invention is to provide a capacitance displacement measuring probe that measures the vibration of a rotor of a dynamoelectric machine wherein a collector ring associated with said rotor has a helical groove therein.

Another object of this invention is to provide a capacitance displacement measuring probe that measures the vibration of the rotor of a dynamoelectric machine without being adversely affected by stray capacitance.

SUMMARY OF THE INVENTION

The present invention is directed to a capacitance displacement probe for measuring the vibrations of a rotor of a dynamoelectric machine. The probe is positioned a fixed distance from and establishes a capacitance relationship with the rotor or rotating member of the dynamoelectric machine and more particularly a collector ring of the rotating member. The probe has a parallelogrammed sensing face with a sensing electrode therein. The sensing electrode has a parallelogrammed sensing surface which scans a parallelogrammed area, of a constant dimension, of the rotating member and senses any change in the distance between the rotating member and the probe caused by vibration of the dynamoelectric machine. The axial length of the sensing surface of the sensing electrode is of a predetermined dimension which depends on the parameter of the surface of the rotor or rotating member of which vibration is to be measured, and more particularly when the collector ring of the rotor, utilized with the probe, is provided with a groove therein.

DETAILED DESCRIPTION OF THE INVENTION

Figure 1:
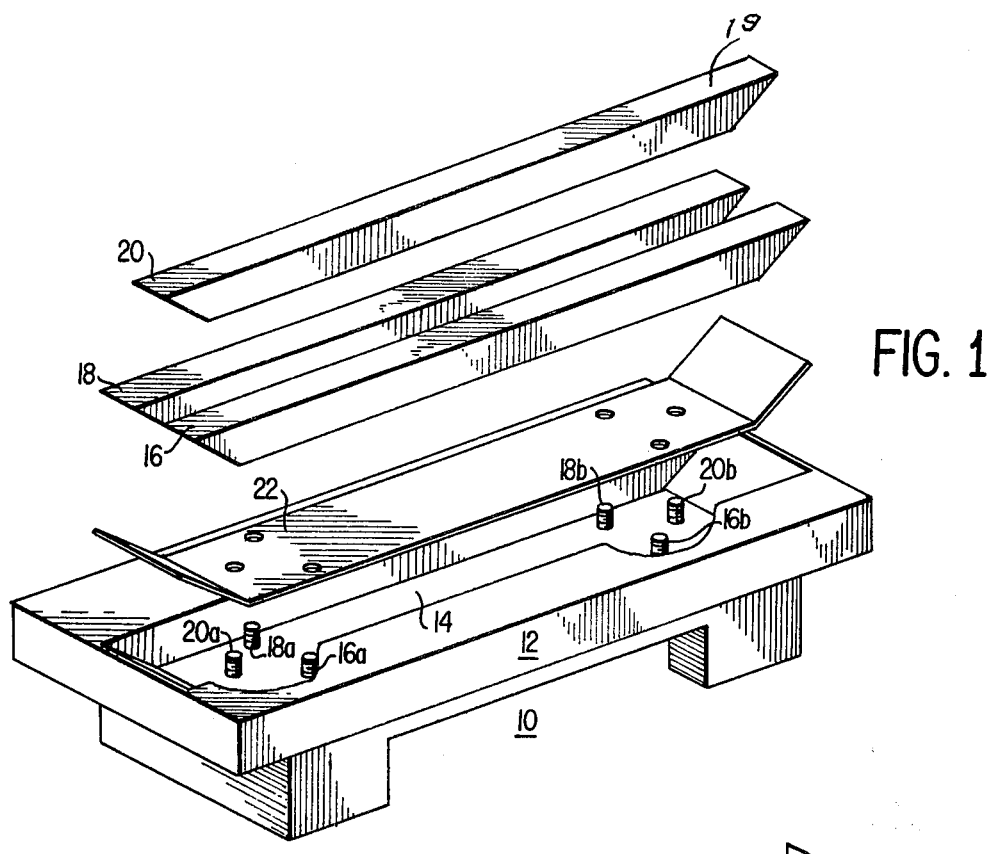
FIG. 1 is an exploded view of the structure of the probe described in the present invention.

Referring to the drawings, the probe 10 of FIG. 1 is formed with a metal housing 12 having an opening or window 14 in one face of said housing. The opening is appropriately formed to accommodate a pair of guard electrodes 16 and 18 and a sensing electrode 20, with the housing 12 forming an electrical shield for the electrodes, exclusive of the electrode surface facing outwardly from the housing, when the electrodes are properly placed within the metal housing.

The sensing electrode 20 is formed with a sensing surface 19 of parallelogram shape which forms one element of the capacitor. This shape permits the electrode to be used with a complementary member of a dynamoelectric machine to provide a predetermined capacitance between the sensing electrode and said complementary member or collector ring which forms the other element of the capacitor as hereinafter more fully described.

One manner of mounting the guard electrodes 16 and 18 and the sensing electrode 20, in proper relationship, one to another within said opening, comprises the provision of mounting bushings such as 16a and 16b, and 18b and 20a and 20b secured to the end wall of said housing opposite said opening 14. The mounting bushings 20a and 20b are formed of an insulating material with mounting bushings 16a, 16b, 18a and 18b being formed of good electrical insulating material. The guard electrodes 16 and 18 are maintained in a fixed spaced apart position respective one another by spot welding or otherwise appropriately affixing the guard electrodes to a base element 21 of a conducting foil 22. The conducting foil 22 is provided with appropriate apertures to permit the fitting thereof over the insulated bushings 16 and 16b, 18a and 18b and 21a and 20b. Base element 21 is dimensioned to snugly fit within the opening 14.

Sensing electrode 20 is mounted on bushings 20a and 20b spaced apart from guard electrodes 16 and 18 and is provided with a wire (not shown for clarity) to provide an output lead from the sensing electrode to the appropriate circuitry to be used therewith. In view of the need to insulate the sensing electrode 20 from the guard electrodes 16 and 18, it is advantageous to have the guard electrodes 16 and 18 and the sensing electrode 20 coated with an insulating material (not shown for clarity) at least for the coextensive portions of 16, 18 and 20 where there is a possibility of contact between said guard electrodes 16 and 18 and the sensing electrode 20. The guard electrodes 16 and 18 and sensing electrode 20 are preferably mounted within shield electrode 12 with the sensing surface 19 and outer surfaces guard electrodes 16 and 18 substantially coextensive with the plane of the outer limits of window 14. After the guard electrodes and sensing electrodes have been placed within the opening 12, it may be desirable, at the option of a user, to overlay the opening and its contents with a dielectric material, well known in the art, to prevent dust or other material from getting into the sensing electrode elements. If desired the housing 12 may also accommodate solid state circuitry for use with the probe.

Figure 3:
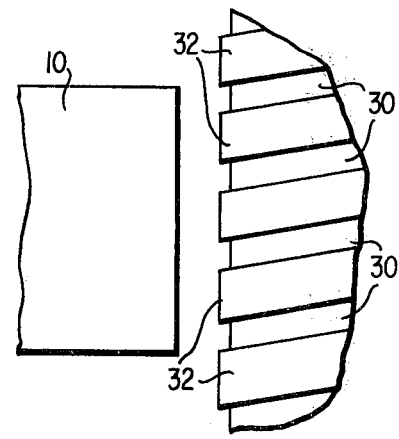
FIG. 3 is an enlarged view of a portion of the collector ring and the orientation of the probe of the present invention to the collector ring.
Figure 2:
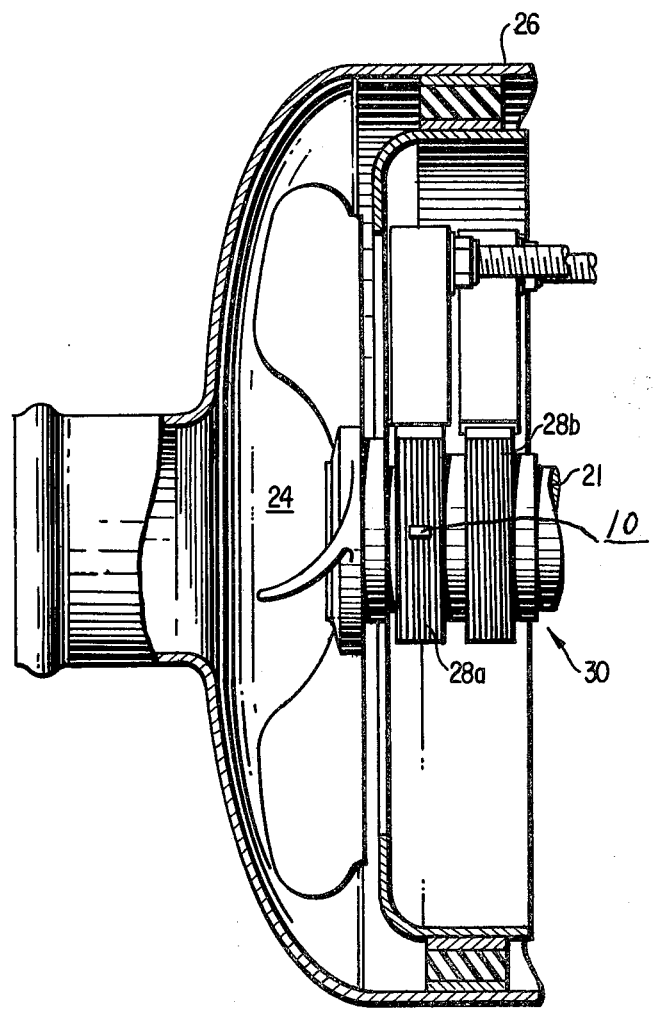
FIG. 2 is a view of the end housing of a dynamoelectric machine showing the probe described in this invention with respect to a collector ring of the dynamoelectric machine.

To show how the probe of the invention is utilized, reference is had to FIG. 2 of the drawing which illustrates an end housing 26 of a motor generator 24. Disposed within the end housing 26 are a pair of collector rings 28a and 28b which form part of rotor 27 of motor generator 24. Collector rings 28a and 28b are provided with a plurality of grooves 30 formed as a spiral and having a predetermined pitch. The probe 10 is spaced from and disposed to span a predetermined plurality of said grooves 30 as more clearly shown in FIG. 3 which is an enlarged view of a portion of collector ring 28a and the probe 10 (disposed relative to the grooves). It will be noted that the probe 20 and more particularly the sensing surface 19 is in a plane parallel to the longitudinal axis of the collector ring 28a. By positioning the probe with its sensing face in parallel with the longitudinal axis of the collector ring, it is assumed that the probe will at all times scan a constant total area of the collector ring during rotation. By scanning a constant total area of the collector ring the measuring of vibration is unaffected by the helical groove in the collector ring. The probe may be mounted in position through use of means well known in the art.

Intermediate the grooves are higher surface area elements 32. It is contemplated that the probe 10 span an area comprising predetermined equal number of grooves 30 and higher surface elements 32. It is thus seen that the dimensions of the probe in a longitudinal dimension will be determined by the number of grooves and high areas to be scanned as well as the pitch of the grooves.

Figure 4:
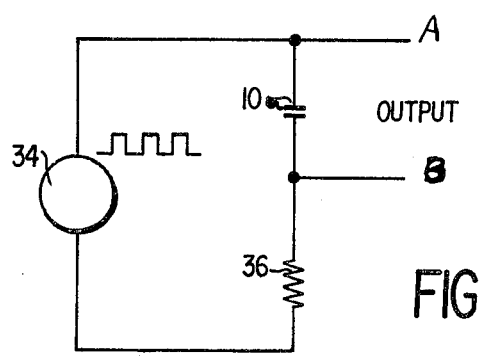
FIG. 4 is an electrical equivalent circuit for measuring the capacitance between the sensing area of the probe and the collector ring.

FIG. 4 is an electrical circuit showing a generator 34 coupled to the probe 10 which is in a series circuit with a resistor 36. The probe 10 is shown in the form of a capacitor 10a and is the electrical equivalent of the capacitance existing between the probe 10 and the collector ring 28a. Not shown for purposes of clarity is the optional application of the generator output signal to the guard electrodes.

In operation, generator 34 provides an AC or alternating current voltage at a predetermined frequency which may be in the order of 20 kilocycles. With capacitor 10 remaining at a constant value, during rotation of the rotor, the output of the probe at terminals A and B would remain constant. If the capacitor 10a were to change value due to vibration in the collector ring as it passes the probe 10 during rotation, a change in output voltage would be developed across capacitor 10a responsive to the vibration of said collector ring 28a. This will be recognized as occurring due to the change in capacitive reactance of the probe to rotor capacitance at the frequency of excitation. The output of the probe is coupled to suitable electronic circuitry well known in the art to provide a reading or signal either on a meter or other appropriate signal equipment, which reading or signal is responsive to the change in capacitance between the probe and collector ring.

The structure of probe 10 provides a sensing element 20 which is unaffected by stray capacitances through use of guard electrodes 16 and 18 which are driven by the 20 KC generator but from which no signal is derived. In the absence of the guard electrodes, 16 and 18 stray capacitance would normally affect the capacitor value which appears between the sensing electrode 20 and the collector ring 28a with which it is intended that the sensing probe be utilized.

While no structure has been shown for mounting the probe 10 with respect to the collector ring, it is obvious that such mounting may be performed in any of numerous manners well known in the art.

As is apparent from the above description of the probe in the present invention, the measurement of vibration of a rotating member such as the collector of a rotor can be achieved without contact of the probe and the rotating member and without the resultant disadvantage of chatter. Further, the measurement of vibration of a rotating member can be achieved irrespective of the velocity or change therein of the rotating member. In addition, because the probe of the present invention measures the vibration of a rotating member along a parallelogrammed area, and not a locus of points on the rotating member, measurement of vibration of a rotating member having a helical groove therein can be achieved. Further, because of the manner in which the electrodes of the probe are positioned and connected together, the accurate measurement of vibration can be achieved without being adversely affected by stray capacitance of the dynamoelectric machine.

While a special embodiment of this invention has been shown and described, it is not intended that the invention be limited to this particular embodiment and is intended by the appended claims to cover all modifications within the spirit and scope of this invention.

We claim:

1. A capacitance displacement probe for measuring the vibrations of a rotating member, wherein the probe forms one element of a capacitor and wherein the rotating member forms a second element of the capacitor and is provided with a plurality of equally spaced apart grooves having a predetermined pitch and higher surface elements intermediate the grooves, said probe comprising:
    a shield electrode, including a window,
    a pair of guard electrodes and
    a sensing electrode having a sensing surface, said sensing surface having a length equal to an integer multiple of equal grooves and higher surface elements of the rotating member with which said probe is to be used,
    first means for securing said guard electrodes within said shield electrode and each having a surface thereof substantially co-extensive with the outer plane of said window,
    second means for mounting said sensing electrode between and electrically insulated from said guard electrodes, with the sensing surface of said sensing electrode being substantially co-extensive with the outer plane of said window, and
    means for electrically connecting said sensing electrode surface to an electrical circuit.

2. A capacitive displacement probe as defined in claim 1, and wherein a dielectric material overlays said window, guard electrodes and sensing surface.

* * * * *